(12) United States Patent
Lin

(10) Patent No.: US 11,716,833 B1
(45) Date of Patent: Aug. 1, 2023

(54) ELECTRONIC APPARATUS WITH AIRFLOW-REVERSING FUNCTION

(71) Applicant: Nanning FuLian FuGui Precision Industrial Co., Ltd., Nanning (CN)

(72) Inventor: Chih-Hsuan Lin, New Taipei (TW)

(73) Assignee: Nanning FuLian FuGui Precision Industrial Co., Ltd., Nanning (CN)

( * ) Notice: Subject to any disclaimer, the term of this patent is extended or adjusted under 35 U.S.C. 154(b) by 0 days.

(21) Appl. No.: 17/679,626

(22) Filed: Feb. 24, 2022

(51) Int. Cl.
*H05K 7/20* (2006.01)

(52) U.S. Cl.
CPC ..... *H05K 7/20736* (2013.01); *H05K 7/20172* (2013.01)

(58) Field of Classification Search
CPC .............. H05K 7/20172; H05K 7/20736
See application file for complete search history.

(56) References Cited

U.S. PATENT DOCUMENTS

| | | | |
|---|---|---|---|
| 5,841,633 A | 11/1998 | Huang | |
| 8,320,120 B1 * | 11/2012 | Chan | H05K 7/20727 165/122 |
| 8,451,605 B2 * | 5/2013 | Chen | H05K 7/20172 361/679.48 |
| 9,999,161 B2 * | 6/2018 | Mease | H05K 7/20727 |

FOREIGN PATENT DOCUMENTS

| | | |
|---|---|---|
| CN | 105864074 A | 8/2016 |
| CN | 105373197 B | 12/2018 |
| TW | 551804 U | 9/2003 |

\* cited by examiner

*Primary Examiner* — Mukundbhai G Patel
(74) *Attorney, Agent, or Firm* — ScienBiziP, P.C.

(57) ABSTRACT

An electronic apparatus with convenient airflow-reversing function includes a chassis, a rotation mechanism, a fan device, a connection rod, and a handle. The chassis includes a bottom plate. The rotation mechanism is pivoted on the bottom plate. The fan device is disposed on the rotation mechanism. The connection rod is pivoted on the rotation mechanism. The handle is pivoted on the chassis, and is rotatably connected to the connection rod. When the handle is rotated, the connection rod drives the rotation mechanism and the fan device to rotate to change the airflow direction.

10 Claims, 6 Drawing Sheets

ELECTRONIC APPARATUS WITH AIRFLOW-REVERSING FUNCTION

FIELD

The subject matter herein generally relates to cooling electronic devices.

BACKGROUND

Servers process high-speed and large amounts of data, and accordingly, a large amount of heat is generated when the server is operating. Requirements for heat dissipation of such servers are extremely high. In addition, when the server is in a different configuration in a room or on a rack, it may be necessary to change the air-flow direction of the fan in the chassis to achieve the best cooling performance.

In the conventional art, the fan can be modularized. The air-flow direction can be changed by inserting the fan module forward or in reverse into a slot of the chassis. However, when the air-flow directions of a large number of servers needs to be changed, the fan modules of each server need to be removed and re-installed, which may be inconvenient during operation.

BRIEF DESCRIPTION OF THE DRAWINGS

Many aspects of the present disclosure are better understood with reference to the following drawings. The components in the drawings are not necessarily drawn to scale, the emphasis instead being placed upon clearly illustrating the principles of the present disclosure. It will be appreciated that for simplicity and clarity of illustration, where appropriate, reference numerals have been repeated among the different figures to indicate corresponding or analogous elements.

DETAILED DESCRIPTION

Figure 1:
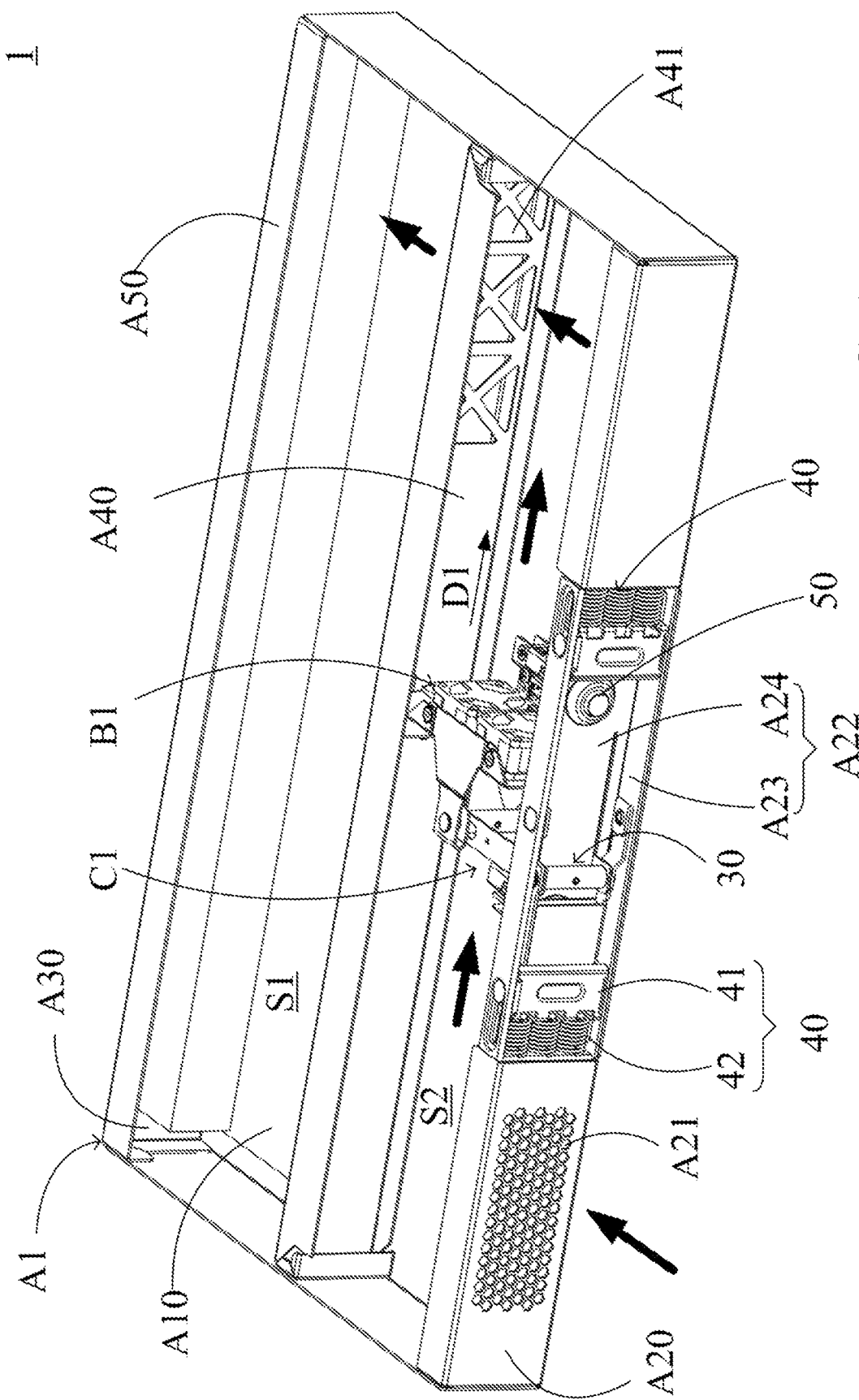
FIG. 1 is a perspective view of an electronic apparatus with airflow-reversing function in accordance with an embodiment of the present disclosure, wherein the fan device and the handle are in a first position.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure.

The disclosure is illustrated by way of embodiments and not by way of limitation in the figures of the accompanying drawings, in which like references indicate similar elements. It should be noted that references to "an" or "one" embodiment in this disclosure are not necessarily to the same embodiment, and such references mean "at least one."

The term "connect" is defined as directly or indirectly through intervening components, and is not necessarily limited to physical connections. The connection can be such that the objects are permanently connected or releasably connected. The term "comprising," when utilized, means "including, but not necessarily limited to"; it specifically indicates open-ended inclusion or membership in the so-described combination, group, series, and the like.

In the present disclosure, an electronic apparatus with airflow-reversing function is provided. The direction of airflow can be turned by operating the handle of the fan device, thereby increasing the convenience of in operation.

Figure 2:
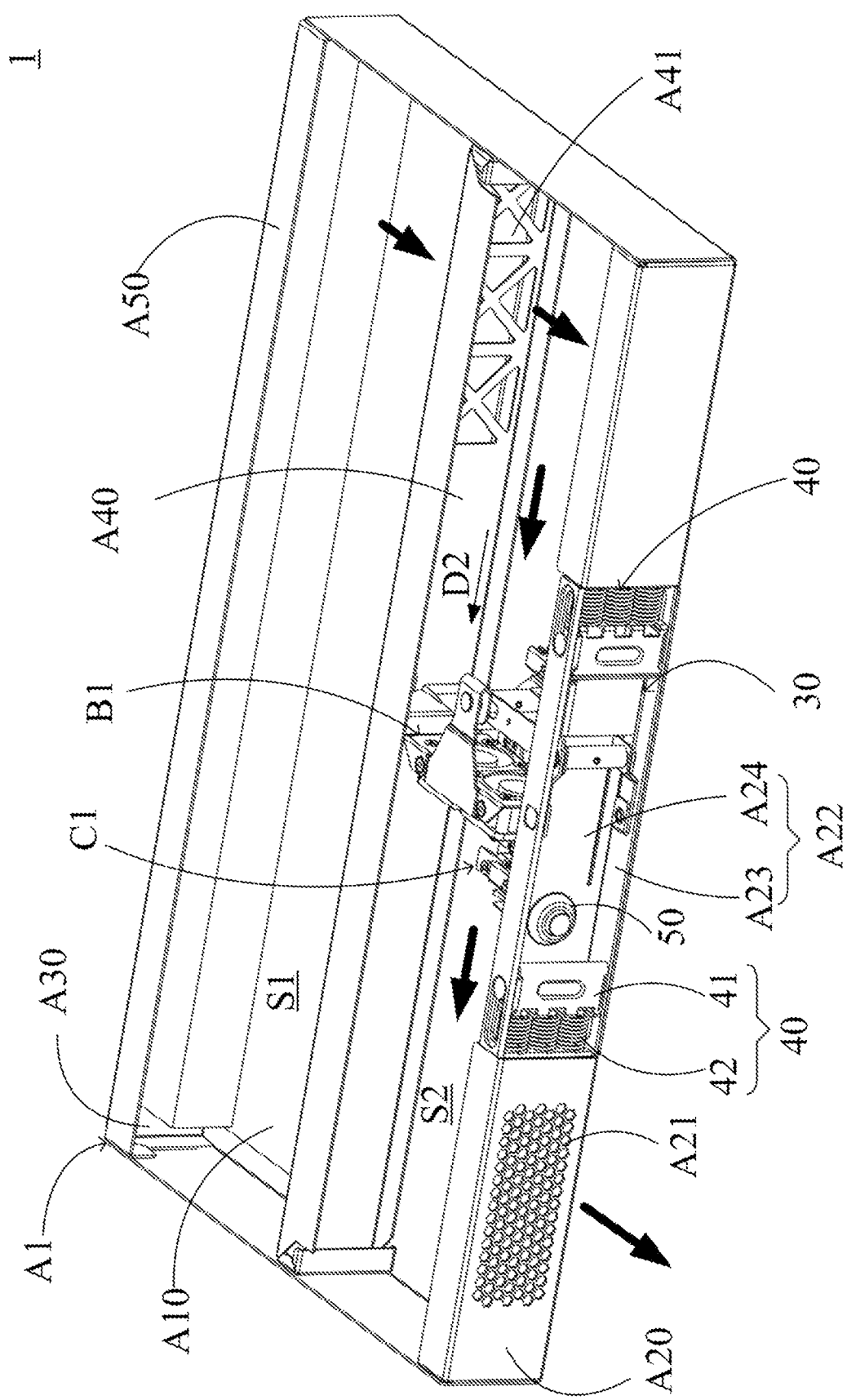
FIG. 2 is a perspective view of the electronic apparatus of FIG. 1, wherein the fan device and the handle are in a second position.

FIG. 1 is a perspective view of an electronic apparatus 1 with airflow-reversing function in accordance with an embodiment of the present disclosure, wherein the fan device B1 and the handle 30 are in a first position. FIG. 2 is a perspective view of the electronic apparatus 1 of FIG. 1, wherein the fan device B1 and the handle 30 are in a second position. The electronic apparatus 1 includes a chassis A1, a fan device B1, and a airflow-reversing device C1.

The chassis A1 includes a bottom plate A10, a rear plate A20, a front plate A30, a separation plate A40, and a top plate A50. The rear plate A20, the front plate A30, and the separation plate A40 extends perpendicular to the bottom plate A10, and the rear plate A20 is parallel to the front plate A30. The separation plate A40 is between the rear plate A20 and the front plate A30, and the separation plate A40 is parallel to rear plate A20 and the front plate A30. For the purpose of clarity, only part of the top plate A50 is drawn in figures. The top plate A50 is parallel to the bottom plate A10. The rear plate A20, the front plate A30, and the separation plate A40 are between the top plate A50 and the bottom plate A10.

In the embodiment, a front chamber S1 is formed between the front plate A30 and the separation plate A40, a rear chamber S2 is formed between the rear plate A20 and the separation plate A40. Electronic components (not shown in figures), such as motherboards or processors, can be disposed in the front chamber S1. The separation plate A40 has one or more inner holes A41 in communication with the front chamber S1 and the rear chamber S2. The chassis A1 has one or more holes (not shown in figures) in communication with the front chamber S2. The rear plate A20 has one or more outer holes A21 in communication with the rear chamber S2 and the outside of the chassis A1. The fan device B1 and the airflow-reversing device C1 are disposed in the rear chamber S2. The fan device B1 is disposed on the airflow-reversing device C1, and the airflow-reversing device C1 can rotate the fan device B1.

As shown in FIG. 1, when the fan device B1 is in the first position, the fan device B1 generates air flow in the first direction D1. The air flow enters the front chamber S1 via the inner hole A41 so as to remove heat from the electronic components in the front chamber S1. Moreover, the fan device B1 draws the air outside chassis A1 into rear chamber S2 through the outer holes A21.

As shown in FIG. 2, when the fan device B1 is in the second position, the fan device B1 generates air flow in the first direction D1. The air flow flows out of the chassis A1 via the outer holes A21. Moreover, the fan device B1 draws the air in the front chamber S1 into the rear chamber S2 via the inner holes A41. Since air heated by the electronic components is drawn out from the front chamber S1, the heat of the electronic components can be removed.

Figure 3:
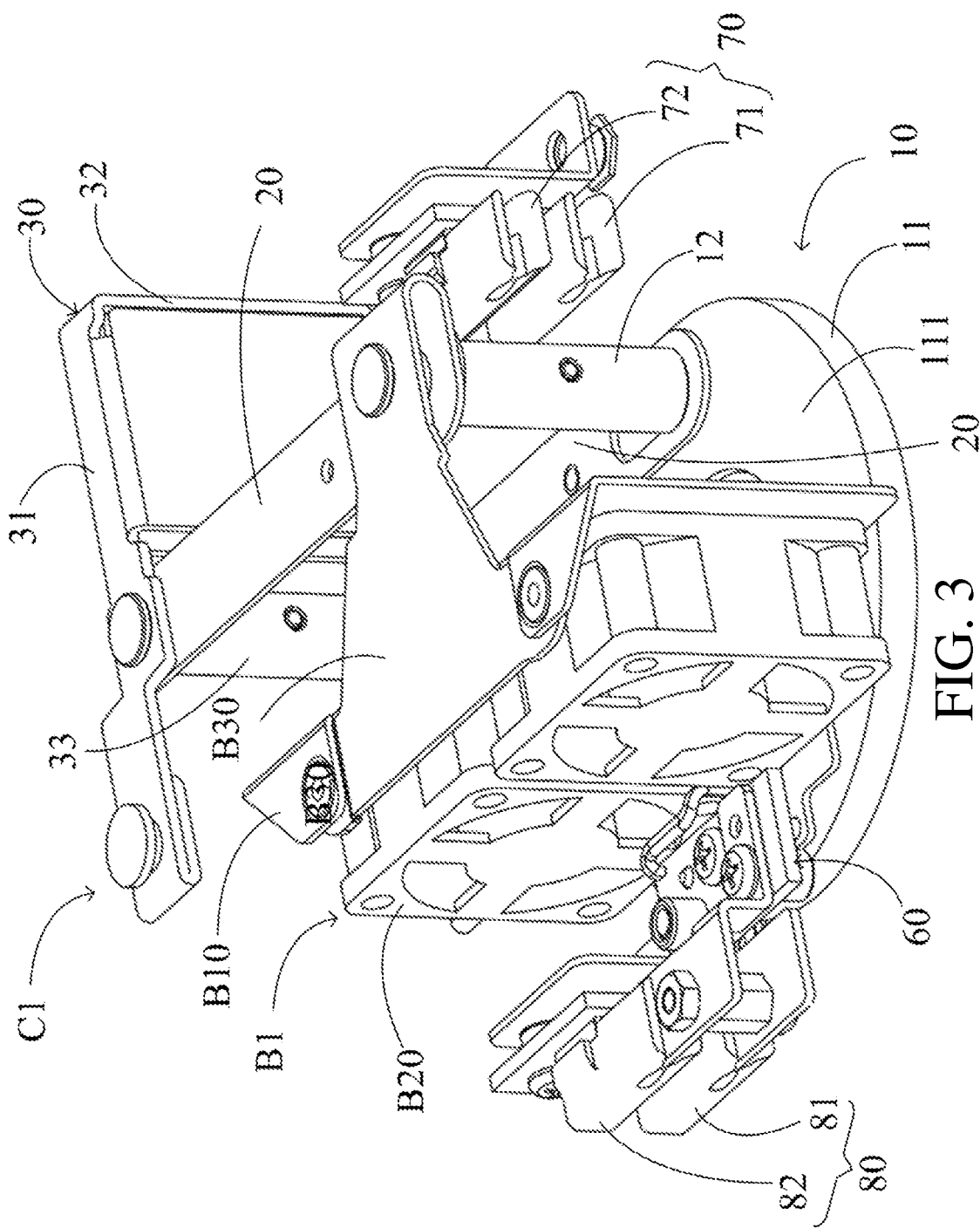
FIG. 3 is a perspective view of the fan device and the airflow-reversing device of FIG. 1, wherein fan device and the handle are in the first position.
Figure 4:
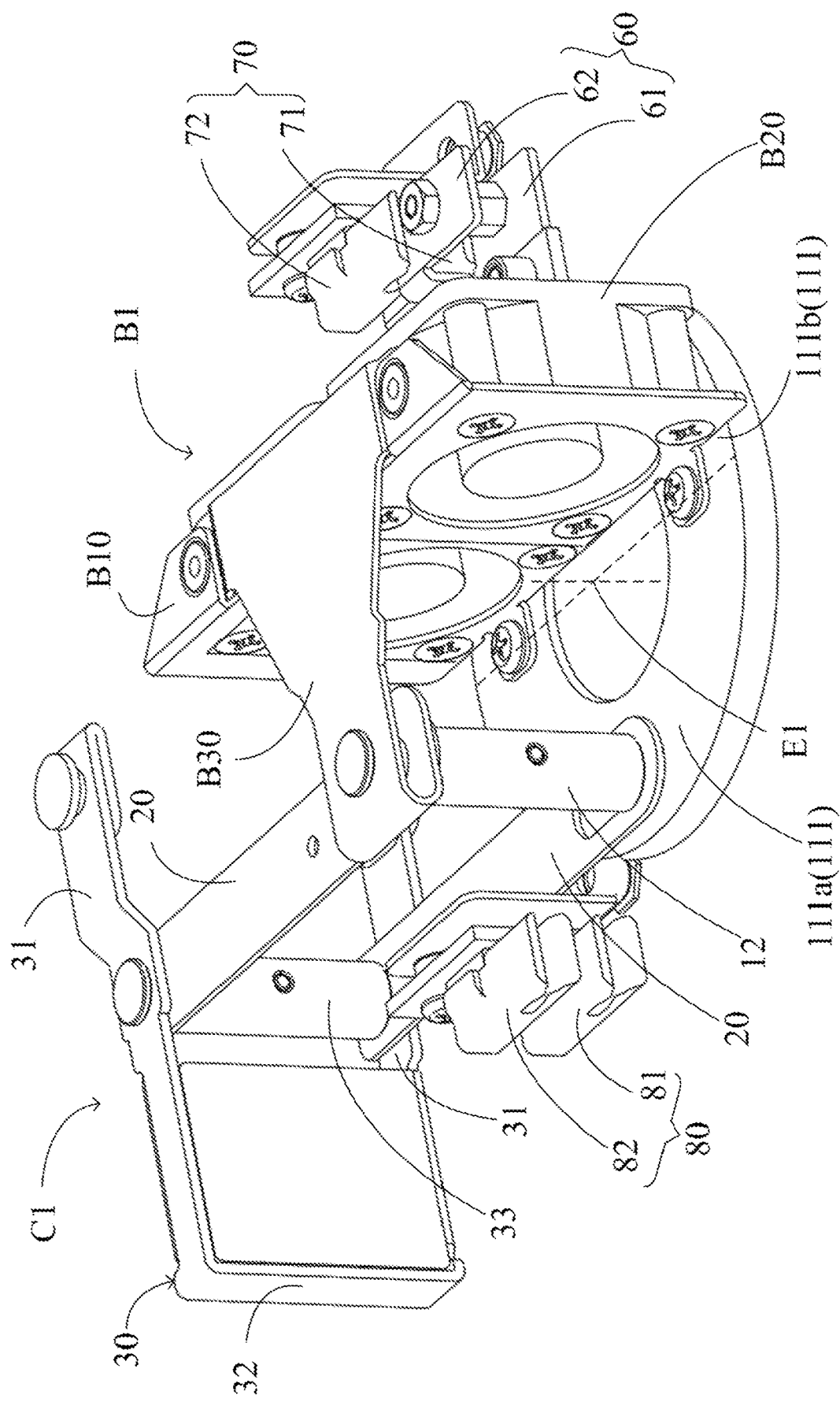
FIG. 4 is a perspective view of the fan device and the airflow-reversing device of FIG. 2, wherein the fan device and the handle are in the second position.

FIG. 3 is a perspective view of the fan device B1 and the airflow-reversing device C1 of FIG. 1, wherein fan device B1 and the handle 30 are in the first position. FIG. 4 is a perspective view of the fan device B1 and the airflow-reversing device C1 of FIG. 2, wherein the fan device B1 and the handle 30 are in the second position. The airflow-reversing device C1 further includes a rotation mechanism 10, two connection rods 20, and a handle 30. The rotation mechanism 10 is pivoted on the bottom plate A10. The fan device B1 is disposed on the rotation mechanism 10. The connection rod 20 is pivoted on the rotation mechanism 10. The handle 30 is pivoted on the chassis A1, and is rotatably connected to the connection rod 20. When the handle 30 is rotated, the connection rod 20 rotates the rotation mechanism 10 and the fan device B1.

The rotation mechanism 10 includes a rotation disk 11 and a rotation shaft 12. The rotation disk 11 is pivoted on the bottom plate A10. In the embodiment, the rotation disk 11 is a circular or annular structure. The rotation shaft 12 is disposed on a bearing surface 111 of the rotation disk 11. In the embodiment, the rotation shaft 12 extends perpendicular to the bearing surface 111 of the rotation disk 11. As shown in FIG. 4, the rotation shaft 12 is on the first segment 111a of the bearing surface 111, and the fan device B1 is disposed on the second segment 111b of the bearing surface 111. The first segment 111a and the second segment 111b are at opposite sides of the center E1 of the rotation disk 11.

The connection rods 20 are pivoted on the rotation shaft 12. The connection rods 20 are parallel to each other, and extend perpendicular to the rotation shaft 12. In the embodiment, the connection rods 20 are on ends of the rotation shaft 12. The fan device B1 includes a frame B10, one or more fans B20, and a rack B30. The frame B10 is affixed to the bearing surface 111 of the rotation disk 11. The fan B20 is affixed to the frame B10. The rack B30 is connected to the frame B10 and the rotation shaft 12. The fan B20 is disposed firmly on the rotation disk 11 by the frame B10 and the rack B30.

The chassis A1 further has a groove A22 formed on the rear plate A20. The handle 30 is pivoted on the wall A23 of the groove A22, and the connection rod 20 passes through the bottom A24. The handle 30 further includes two connection portions 31, a holding portion 32, and a shaft portion 33. The connection portions 31 are pivoted on the walls A23 of the groove A22, and the connection portions 31 are parallel to each other. The holding portion 32 is connected to ends of the connection portions 31. The shaft portion 33 is connected to the connection portions 31, and rotatably connected to the connection rods 20. In the embodiment, the connection portions 31 and the holding portion 32 form a U-shaped structure. The ends of the shaft portion 33 are connected to the central segments of the connection portions 31. The shaft portion 33 is perpendicular to the connection portions 31. The shaft portion 33 and the connection portions 31 form an H-shaped structure. Moreover, the shaft portion 33 is parallel to the rotation shaft 12.

The airflow-reversing device C1 further includes two latch mechanisms 40 and two elastic mechanisms 50. The latch mechanisms 40 are disposed in opposite ends of the groove A22, and can restrict or allow the rotation of the handle 30. Each latch mechanism 40 includes a latch 41 and a spring 42. The latch 41 can restrict or allow the rotation of the handle 30. The spring 42 is connected to the latch mechanism 40 and the chassis A1, and provides elastic force to the latch 41. The elastic mechanism 50 is disposed on the bottom A24 of the groove A22, and adjacent to the latch mechanism 40. The elastic mechanism 50 provides elastic force to the handle 30.

When the handle 30 is in the first position, the connection portion 31, the holding portion 32, and the shaft portion 33 handle 30 are in the groove A22. One of the latches 41 engages the holding portion 32 to restrict the handle 30 in the first position. When the handle 30 is in the second position, the connection portion 31, the holding portion 32, and the shaft portion 33 of the handle 30 are in the groove A22. The other one of the latches 41 engages the holding portion 32 to restrict the handle 30 in the second position. Therefore, the handle 30 can be stored in chassis A1 due to the groove A22 and the latch mechanism 40.

The airflow-reversing device C1 further includes a main connector 60, a first connector 70, and a second connector 80. The main connector 60 is disposed in the fan device B1. The main connector 60 is disposed on the frame B10, and is electrically connected to the fan B20. The first connector 70 and the second connector 80 are disposed on the bottom plate A10. The rotation mechanism 10 is between the first connector 70 and the second connector 80.

In the embodiment, the main connector 60 includes a positive plate 61 and a negative plate 62. The first connector 70 includes a first positive socket 71 and a first negative socket 72. As shown in FIG. 3, when the handle 30 is rotated to the first position, the main connector 60 is connected to the first connector 70. Moreover, when the main connector 60 is connected to the first connector 70, the positive plate 61 is inserted into the first positive socket 71, and the negative plate 62 is inserted into the first negative socket 72.

In the embodiment, the second connector 80 includes a second positive socket 81 and a second negative socket 82. As shown in FIG. 4, when the handle 30 is rotated to the second position, the main connector 60 is connected to the second connector 80. Moreover, when the main connector 60 is connected to the second connector 80, the positive plate 61 is inserted into the second positive socket 81, and the negative plate 62 is inserted into the second negative socket 82.

Accordingly, power wires connected to the fan B20 will not tangle or be cut when the fan device B1 is rotated, due to the design of the main connector 60, the first connector 70, and the second connector 80.

Figure 5:
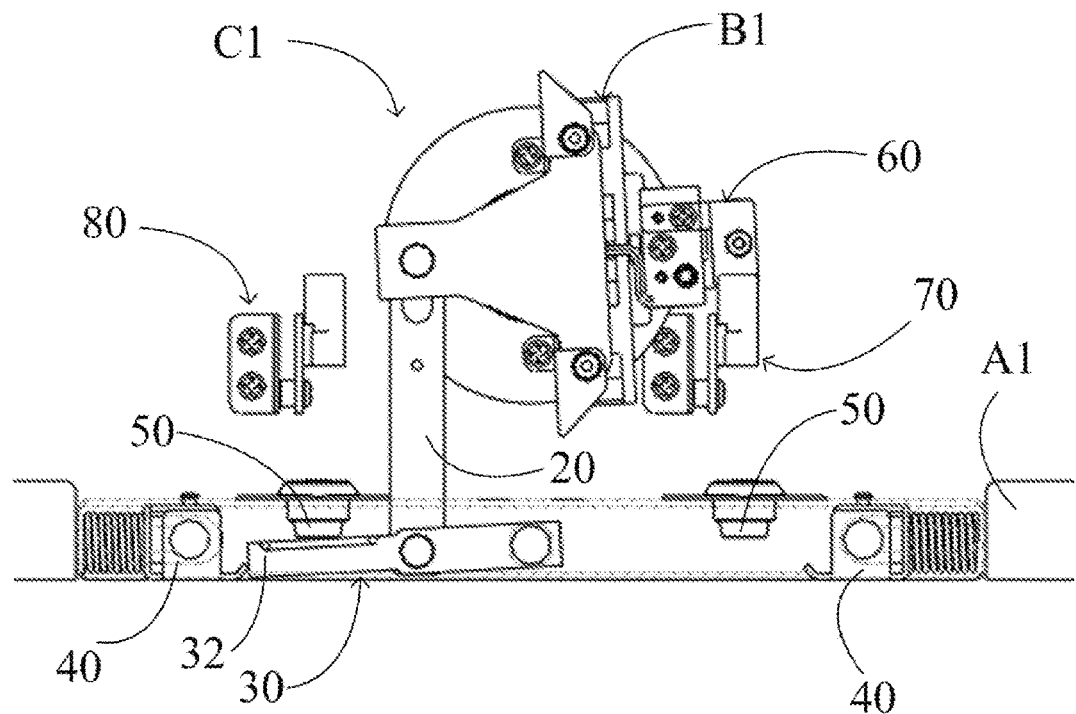
FIG. 5, FIG. 6, FIG. 7, and FIG. 8 are schematic views of the airflow-reversing device in respective steps of an operation.

FIG. 5 to FIG. 8 are schematic views of the airflow-reversing device C1 during operation steps. In FIG. 1, the handle 30 and the fan device B1 are in the first position. The main connector 60 is connected to the first connector 70. The current is supplied to the fan device B1 through the first connector 70 and the main connector 60, and the fan device B1 generates an air flow in the first direction D1. As shown in FIG. 5, when the direction of the air flow is to be changed, the latch mechanism 40 is pulled to release the handle 30. At this time, the elastic mechanism 50 ejects the handle 30 for easy operation by the user.

Figure 6:
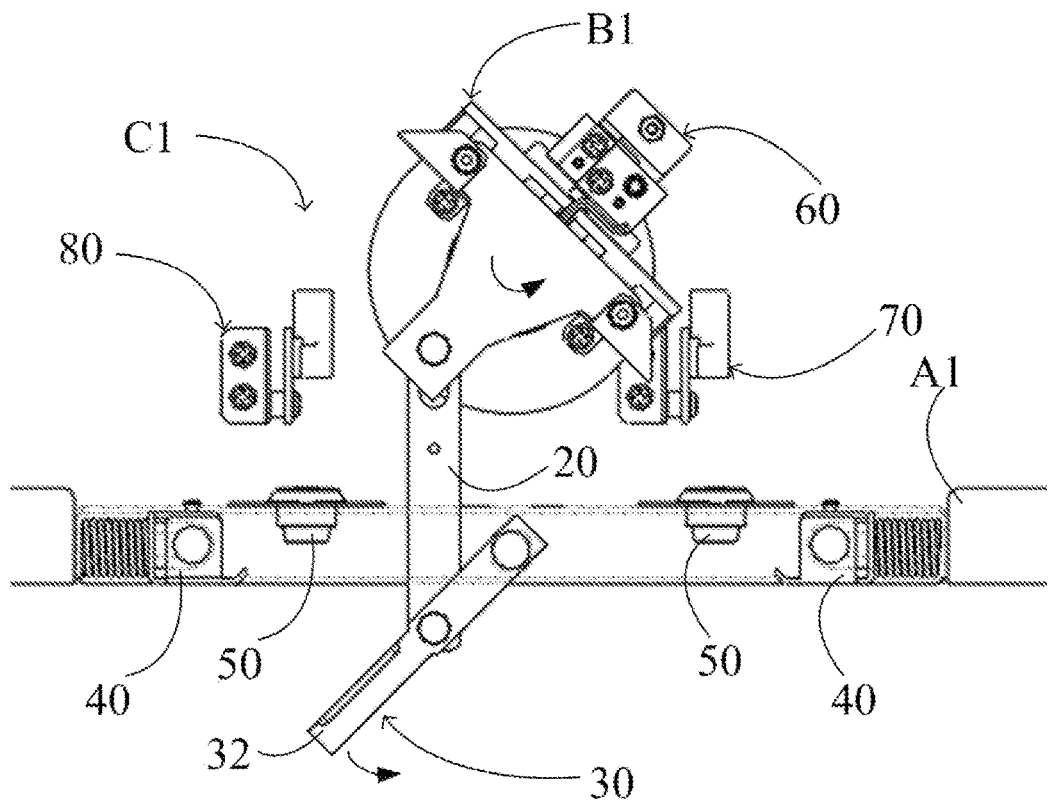
Figure 7:
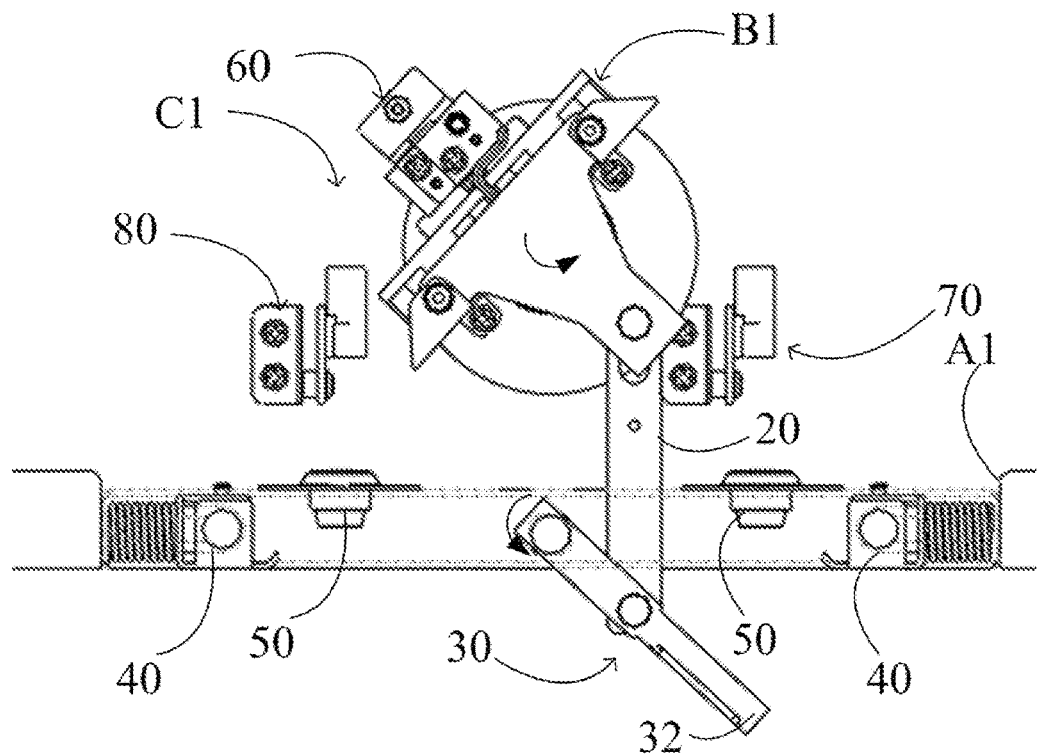
Figure 8:
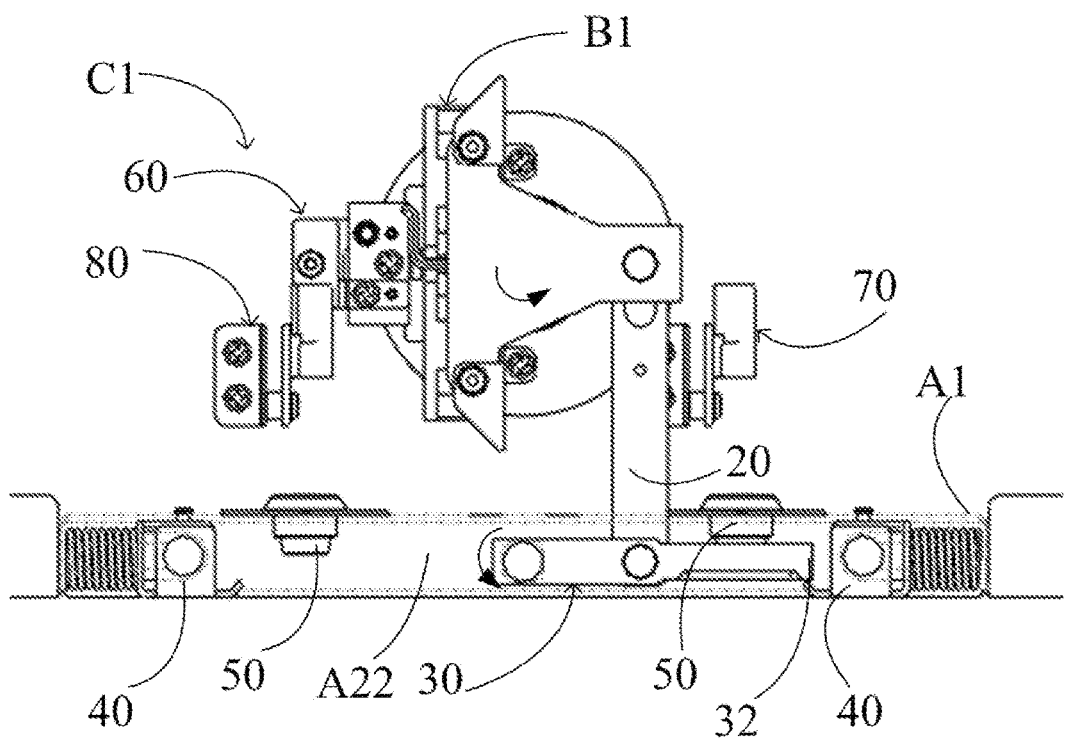

As shown in FIG. 6 and FIG. 7, the handle 30 is rotated, so that the connection rod 20 rotates the rotation mechanism 10 and the fan device B1. As shown in FIG. 8, the holding portion 32 of the handle 30 is pressed into the groove A22. The latch mechanism 40 engages the handle 30 to prevent the holding portion 32 of the handle 30 from being ejected from the groove A22 by the elastic mechanism 50.

In the present disclosure, the fan device in the chassis can be rotated by operating the handle to achieve a change in the direction of the air flow, thereby increasing the convenience of the operation.

Many details are often found in the relevant art, thus many such details are neither shown nor described. Even though numerous characteristics and advantages of the present technology have been set forth in the foregoing description, together with details of the structure and function of the present disclosure, the disclosure is illustrative only, and changes may be made in the detail, especially in matters of shape, size, and arrangement of the parts within the principles of the present disclosure, up to and including the full extent established by the broad general meaning of the terms used in the claims. It will, therefore, be appreciated that the embodiments described above may be modified within the scope of the claims.

What is claimed is:

1. An electronic apparatus with airflow-reversing function, comprising:
    a chassis comprising a bottom plate;
    a rotation mechanism pivoted on the bottom plate;
    a fan device disposed on the rotation mechanism;
    a connection rod pivoted on the rotation mechanism; and
    a handle pivoted on the chassis, and rotatably connected to the connection rod;
    wherein when the handle is rotated, the connection rod drives the rotation mechanism and the fan device to rotate.

2. The electronic apparatus with airflow-reversing function as claimed in claim 1, wherein the rotation mechanism comprising:
    a rotation disk pivoted on the bottom plate; and
    a rotation shaft disposed on a first segment of a bearing surface of the rotation disk;
    wherein the connection rod is pivoted on the rotation shaft, the fan device is disposed on a second segment of the bearing surface, and the first segment and the second segment are at opposite sides of a center of the rotation disk.

3. The electronic apparatus with airflow-reversing function as claimed in claim 1, further comprising:
    a main connector disposed on the fan device;
    a first connector disposed on the bottom plate; and
    a second connector disposed on the bottom plate;
    wherein when the handle is rotated to a first position, the main connector is connected to the first connector, and the handle is rotated to a second position, the main connector is connected to the second connector.

4. The electronic apparatus with airflow-reversing function as claimed in claim 3, wherein the rotation mechanism is between the first connector and the second connector.

5. The electronic apparatus with airflow-reversing function as claimed in claim 3, wherein the first connector comprises a first positive socket and a first negative socket, the main connector comprises a positive plate and a negative plate,
    wherein when the main connector is connected to the first connector, the positive plate is inserted into the first positive socket, and the negative plate is inserted into the first negative socket.

6. The electronic apparatus with airflow-reversing function as claimed in claim 3, wherein the second connector comprises a second positive socket and a second negative socket, the main connector comprises a positive plate and a negative plate,
    wherein when the main connector is connected to the second connector, the positive plate is inserted into the second positive socket, and the negative plate is inserted into the second negative socket.

7. The electronic apparatus with airflow-reversing function as claimed in claim 1, wherein the handle further comprises:
    a connection portion pivoted on the chassis;
    a holding portion connected to an end of the connection portion; and
    a shaft portion is connected to the connection portion, and is rotatably connected to the connection rod.

8. The electronic apparatus with airflow-reversing function as claimed in claim 1, wherein the chassis further comprises a rear plate and a groove formed on the rear plate, the handle is pivoted on a wall of the groove, and the connection rod passes through the bottom.

9. The electronic apparatus with airflow-reversing function as claimed in claim 8, further comprising a latch mechanism disposed in the groove and configured to restrict or allow a rotation of the handle.

10. The electronic apparatus with airflow-reversing function as claimed in claim 9, further comprising an elastic mechanism disposed on the bottom and configured to provide an elastic force to the handle.

* * * * *